United States Patent
Wang et al.

(10) Patent No.: US 10,806,057 B2
(45) Date of Patent: Oct. 13, 2020

(54) MULTI-NODE SYSTEM-FAN-CONTROL SWITCH

(71) Applicant: QUANTA COMPUTER INC., Taoyuan (TW)

(72) Inventors: Shuen-Hung Wang, Taoyuan (TW); Ting-Chen Ko, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 5 days.

(21) Appl. No.: 15/673,031

(22) Filed: Aug. 9, 2017

(65) Prior Publication Data

US 2019/0053405 A1 Feb. 14, 2019

(51) Int. Cl.
| | |
|---|---|
| H05K 7/20 | (2006.01) |
| G06F 1/20 | (2006.01) |
| G05D 23/19 | (2006.01) |
| G06F 1/26 | (2006.01) |

(52) U.S. Cl.
CPC ..... *H05K 7/20836* (2013.01); *G05D 23/1932* (2013.01); *G06F 1/20* (2013.01); *G06F 1/206* (2013.01); *G06F 1/26* (2013.01)

(58) Field of Classification Search
USPC .......................................................... 307/48
See application file for complete search history.

(56) References Cited

U.S. PATENT DOCUMENTS

| | | | | |
|---|---|---|---|---|
| 5,184,025 A * | 2/1993 | McCurry | .................. | G06F 1/28 307/48 |
| 5,906,315 A * | 5/1999 | Lewis | ...................... | F24F 11/30 236/49.3 |
| 8,782,462 B2 * | 7/2014 | Wang | .................. | H04L 41/0856 714/4.11 |
| 2001/0025208 A1 * | 9/2001 | Bartur | .................... | A61J 7/0481 700/231 |
| 2006/0101833 A1 * | 5/2006 | Lucas | ...................... | G06F 1/206 62/126 |
| 2012/0203393 A1 * | 8/2012 | Dumitru | ................. | G06F 1/206 700/300 |

(Continued)

FOREIGN PATENT DOCUMENTS

| | | | |
|---|---|---|---|
| CN | 102622279 A | * | 8/2012 |
| CN | 102622279 A | | 8/2012 |

(Continued)

OTHER PUBLICATIONS

TW Office Action for Application No. 107110472, dated Dec. 14, 2018, w/ First Office Action Summary.

(Continued)

*Primary Examiner* — Emilio J Saavedra
(74) *Attorney, Agent, or Firm* — Nixon Peabody LLP

(57) ABSTRACT

Various examples of the present disclosure provide a multi-node fan control switch and systems and methods for controlling one or more cooling fans of a node using a fan control switch and a specific controller (e.g., BMC or a specific processor) of the node. The node also includes a watch dog circuit. The watch dog circuit can monitor health of the specific controller and, in response to determining that the specific controller has failed, enable the fan control switch to an external mode to allow a controller of a neighboring node in the rack system to control the one or more cooling fans of the node.

20 Claims, 9 Drawing Sheets

(56) References Cited

U.S. PATENT DOCUMENTS

| | | | | |
|---|---|---|---|---|
| 2014/0025208 A1* | 1/2014 | Allen-Ware | ........ | G05D 23/1934 |
| | | | | 700/276 |
| 2015/0282385 A1* | 10/2015 | Pamley | .............. | H05K 7/20209 |
| | | | | 361/679.48 |
| 2017/0017280 A1 | 1/2017 | Nakanishi et al. | | |
| 2017/0168530 A1* | 6/2017 | Remis | ..................... | G06F 1/206 |

FOREIGN PATENT DOCUMENTS

| | | | |
|---|---|---|---|
| TW | I530776 B | * | 4/2016 |
| TW | I530776 B | | 4/2016 |
| WO | 2016016925 A1 | | 2/2016 |

OTHER PUBLICATIONS

TW Search Report for Application No. 107110472, dated Dec. 14, 2018, w/ First Office Action.

JP Office Action for Application No. 2018-106464, dated Apr. 16, 2019, w/ First Office Action Summary.

* cited by examiner

US 10,806,057 B2

MULTI-NODE SYSTEM-FAN-CONTROL SWITCH

TECHNICAL FIELD

The present disclosure relates generally to a server system in a telecommunications network.

BACKGROUND

Modern server farms or datacenters typically employ a large number of servers to handle processing needs for a variety of application services. Each server handles various operations and requires a certain level of power consumption to maintain these operations. Some of these operations are "mission critical" operations, interruptions to which may lead to significant security breach or revenue losses for users associated with these operations. Excessive heat within a server system can cause interruptions to operations of the server system.

Cooling fans have been widely used in server systems to remove excessive heat from the systems. In conventional server systems, a chassis manager controller (CM) is typically used in a server rack system to read CPU and Hard drive (HDD) temperatures in the rack system and control fan speeds of cooling fans of the rack system.

However, it remains a challenge to improve efficiencies and reliability of fan control schemes in server systems.

SUMMARY

Systems and methods in accordance with various examples of the present disclosure provide a multi-node fan control switch for each of the plurality of nodes in a rack system and a solution to the above-mentioned problems by using a controller of a node to manage one or more cooling fans of the node and using a different controller of a neighboring node in the rack system as a backup controller. More specifically, various examples of the present disclosure provide systems and methods for controlling one or more cooling fans of a node using a fan control switch and a specific controller (e.g., BMC or a specific processor) of the node. The node also includes a watch dog circuit. The watch dog circuit can monitor health of the specific controller and, in response to determining that the specific controller has failed, enable the fan control switch to an external mode and allow a controller of a neighboring node in the rack system to control the one or more cooling fans of the node.

In some examples, the specific controller can further receive temperature information (e.g., temperature of CPU, specific controller, or hard drive (HDD)) of the node and control fan speeds of the one or more cooling fans based at least upon the temperature information of the node. In some implementations, the commands from the specific controller are PWM signals operable to control the one or more cooling fans.

In some examples, the watch dog circuit can receive heartbeat signals from the specific controller. In response to not receiving heart beat signals for a predetermined time period, the watch dog circuit can determine that the specific controller has failed.

In some examples, the watch dog circuit can actively test health of the specific controller. In an event that any operating parameter of the specific controller goes beyond a predetermined specification, the watch dog circuit can determine that the specific controller has failed and subsequently enable the fan control switch to an external mode.

In some examples, the watch dog circuit receives status information of an AC power supply and a power supply unit (PSU) of the node. The watch dog circuit enables the fan control switch of the node to an external mode only if the AC power supply and the PSU are okay.

In some implementations, the specific controller in a node is connected to one or more cooling fans of a neighboring node and can receive their status information (e.g., fan rotor status of each cooling fan). In response to determining that a fan control switch of the neighboring node has been switched to an external mode, the specific controller can send commands to control fan speeds of the one or more cooling fans of the neighboring node based at least upon the status information of the one or more cooling fans of the neighboring node.

In some examples, the specific controller can send commands to the one or more cooling fans of the neighboring node such that the one or more cooling fans operate under a default speed. In some other examples, the specific controller can further receive temperature information (e.g., temperature of CPU, HDD or a specific controller) of the neighboring node and control fan speeds of the one or more cooling fans of the neighboring node based at least upon the temperature information of the neighboring node.

In some examples, the neighboring node can be a dummy tray with one or more cooling fans. A fan control switch of the neighboring node can be automatically set to an external mode in response to detecting no server system in the dummy tray. The specific controller can receive status information (e.g., fan rotor status of each cooling fan) of the one or more cooling fans in the dummy tray and send commands to control fan speeds of the one or more cooling fans based at least upon received status information.

In some implementations, the rack system comprises three or more nodes. Each specific controller of the three or more nodes is also connected to one or more cooling fans of a neighboring node in the rack system. A specific controller of a node can send commands to control fan speeds of one or more cooling fans of a neighboring node, in response to determining that a fan control switch of the neighboring node is switched to an external mode.

BRIEF DESCRIPTION OF THE DRAWINGS

In order to describe the manner in which the above-recited and other advantages and features of the disclosure can be obtained, a more particular description of the principles briefly described above will be rendered by reference to specific examples thereof which are illustrated in the appended drawings. Understanding that these drawings depict only example aspects of the disclosure and are not therefore to be considered to be limiting of its scope, the principles herein are described and explained with additional specificity and detail through the use of the accompanying drawings in which.

DETAILED DESCRIPTION

Figure 1A:
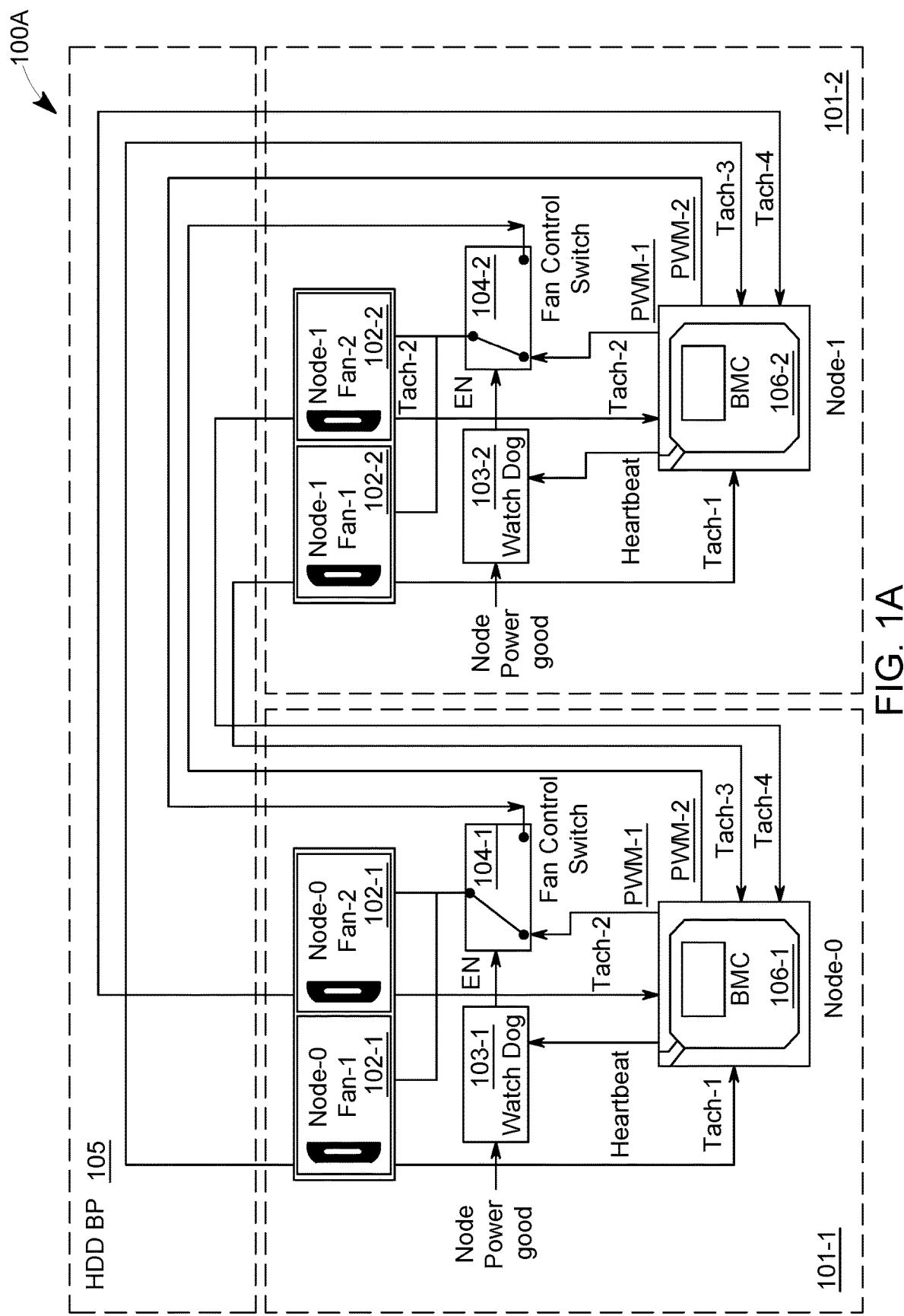
FIGS. 1A-1B are schematic block diagrams illustrating two exemplary server systems in a rack system, each server system having a watch dog circuit and a fan control switch, in accordance with an implementation of the present disclosure.

The present disclosure can be embodied in many different forms. There are shown in the drawings, and will herein be described in detail, representative embodiments with the understanding that the present disclosure is to be considered as an exemplification or illustration of the principles of the present disclosure and is not intended to limit the broad aspects of the disclosure to the embodiments illustrated. To that extent, elements and limitations that are disclosed, for example, in the Abstract, Summary, and Detailed Description sections, but not explicitly set forth in the claims, should not be incorporated into the claims, singly or collectively, by implication, inference, or otherwise. For purposes of the present detailed description, unless specifically disclaimed: the singular includes the plural and vice versa; and the word "including" means "including without limitation." Moreover, words of approximation, such as "about," "almost," "substantially," "approximately," and the like, can be used herein in the sense of "at, near, or nearly at," or "within 3-5% of," or "within acceptable manufacturing tolerances," or any logical combination thereof, for example.

Various examples of the present disclosure provide methods and systems for using a multi-node fan control switch and a specific controller (e.g., BMC or a specific processor) of a node to control one or more cooling fans of the node. The node also includes a watch dog circuit. The watch dog circuit can monitor health of the specific controller and, in response to determining that the specific controller has failed, enable the fan control switch to an external mode and allow a controller of a neighboring node in the rack system to control the one or more cooling fans of the node.

FIG. 1A is a schematic block diagram illustrating two exemplary server systems in a rack system 100A, each server system having a watch dog circuit and a fan control switch, in accordance with an implementation of the present disclosure. In this example, the system 100A comprises a backplane 105 and two server systems 101-1 and 101-2. Each server system comprises one or more cooling fans (e.g., 102-1 and 102-2), a watch dog circuit (e.g., 103-1 and 103-2), a fan control switch (e.g., 104-1 and 104-2), and a baseboard management controller (BMC) (e.g., 106-1 and 106-2). The BMC 106-1 of the server system 101-1 is connected to one or more cooling fans 102-1 via the fan control switch 104-1 and also connected to one or more cooling fans 102-2 of the neighboring server system 101-2 via the backplane 105 and the fan control switch 104-2. Similarly, the BMC 106-2 of the server system 101-2 is connected to one or more cooling fans 102-2 via the fan control switch 104-2 and also connected to one or more cooling fans 102-1 of the neighboring server system 101-1 via the backplane 105 and the fan control switch 104-1.

In this example, BMC (e.g., 106-1 or 106-2) of a specific server system can receive status information (e.g., fan rotor status of each cooling fan) of one or more cooling fans of the specific server system. BMC (e.g., 106-1 or 106-2) can also receive temperature information (e.g., temperature of CPU or BMC) of the specific server system. In an event that the fan control switch of the specific server system is enabled to an internal mode, BMC can control fan speeds of one or more cooling fans on the specific server system based at least upon received temperature information. In some implementations, BMC controls speeds of the one or more cooling fans by sending pulse-width modulation (PWM) signals to the one or more cooling fans.

Figure 1B:
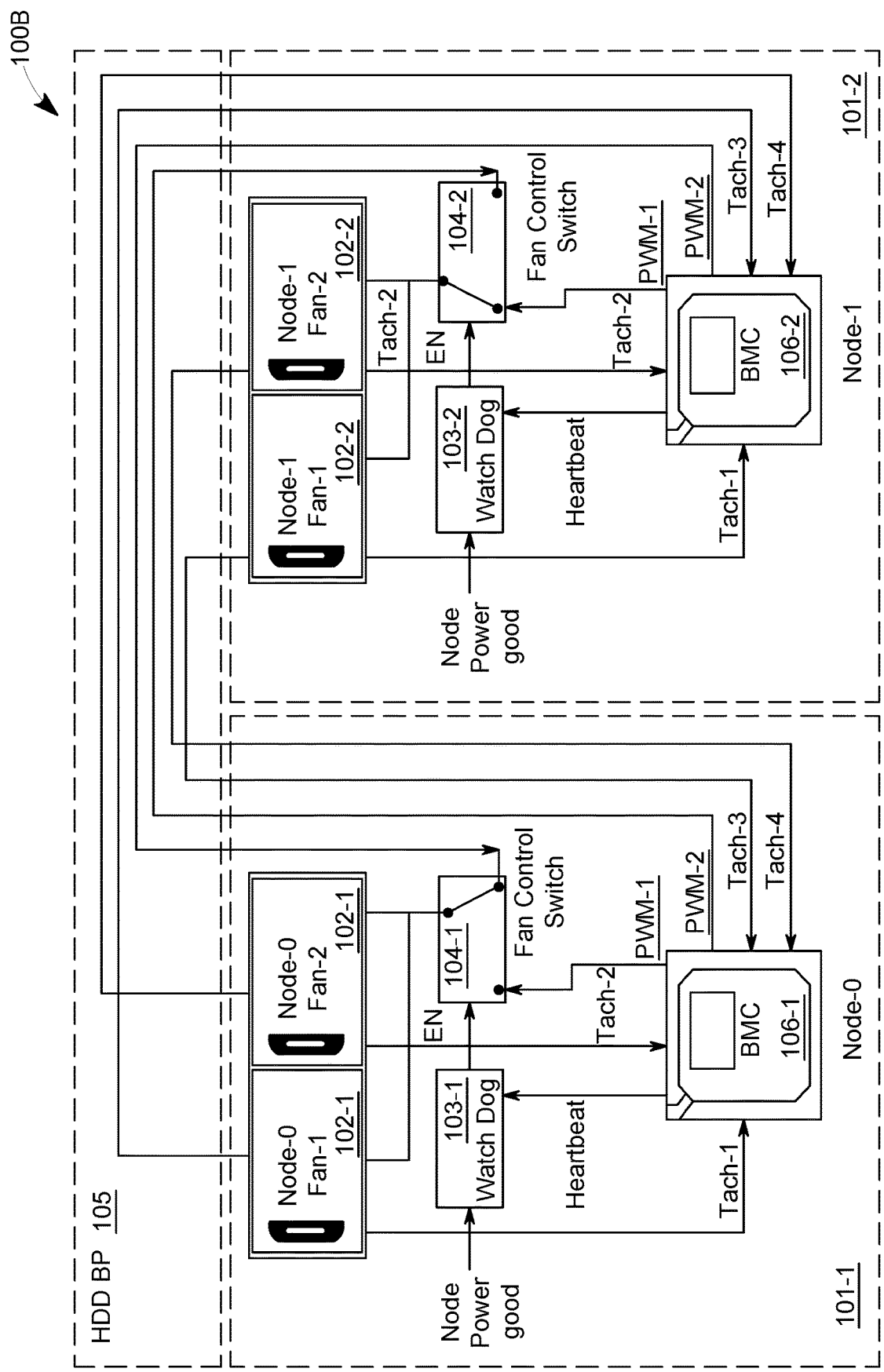

Each watch dog circuit (e.g., 103-1 and 103-2) can monitor health of a corresponding BMC (e.g., 106-1 and 106-2) on the same server system and, in response to determining that the corresponding BMC has failed, enable a corresponding fan control switch on the same server system to an external mode and allow a BMC of a neighboring server system to control corresponding one or more cooling fans on the same server system. For example, a watch dog circuit of a specific server system can receive heartbeat signals from a corresponding BMC of the specific server system. In response to determining that no heart beat signal has been received within a predetermined time period, the watch dog circuit can determine that the corresponding BMC has failed and then enable a corresponding fan control switch of the specific server system to an external mode and allow a different BMC of a neighboring server system to control corresponding one or more cooling fans of the specific server system. This scenario is illustrated in FIG. 1B, in which the fan control switch 104-1 is enabled to an external mode and allows the BMC 106-2 of the neighboring node 101-2 to control the one or more cooling fans of the node 101-1.

For another example, the watch dog circuit can actively monitor health of a corresponding BMC of a specific server system. In an event that the corresponding BMC acts abnormally, the watch dog circuit can determine that the BMC has failed and then enable the fan control switch of the specific server system to an external mode and allow a different BMC of a neighboring server system to control one or more cooling fans of the specific server system.

In some implementations, each watch dog circuit (e.g., 103-1 and 103-2) is also connected to a power supply unit (PSU) of a corresponding server system or the rack system 100A and can receive status information of an AC power supply and the PSU of the corresponding server system from the PSU. The watch dog circuit enables a corresponding fan control switch to an external mode only if the AC power supply and the PSU are okay on the corresponding server system. Table 1 illustrates an exemplary logic truth table for the watch dog circuit (e.g., 103-1 and 103-2), in accordance with an implementation of the present disclosure. In an event that the AC power supply and the PSU of a corresponding node is ok (i.e., "1") and heartbeat signal for a corresponding controller is received (i.e., "1"), the watch dog circuit enables a corresponding fan control switch to an internal mode (i.e., "1") and disable an external mode (i.e., "0"). In an event that the AC power supply and the PSU of the corresponding node is ok (i.e., "1") but the heartbeat signal from the corresponding controller have not been received within a predetermined time period (i.e., "0"), the watch dog circuit enables the corresponding fan control switch to the external mode (i.e., "1") and disable the internal mode (i.e., "0"). In all events that the AC power supply or the PSU of the corresponding node has failed (i.e., "0"), the watch dog circuit enables the corresponding fan control switch to the internal mode (i.e., "1") and disable the external mode (i.e., "0").

TABLE 1

| Power | Heartbeat | Internal mode | External mode |
|-------|-----------|---------------|---------------|
| 1 | 1 | 1 | 0 |
| 1 | 0 | 0 | 1 |
| 0 | 1 | 1 | 0 |
| 0 | 0 | 1 | 0 |

In some examples, a BMC of a specific server system can receive status information (e.g., fan rotor status of each cooling fan) of one or more cooling fans of a neighboring server system. The BMC may further receive temperature information of (e.g., temperature of CPU, HDD or BMC) of the neighboring server system if a fan control switch of the neighboring server system is enabled to an external mode. The BMC can control fan speeds of one or more cooling fans of the neighboring server system based at least upon received temperature information of the neighboring server system. In some examples, the BMC can control fan speeds of one or more cooling fans of the neighboring server system according to default or predetermined parameters.

Figure 1C:
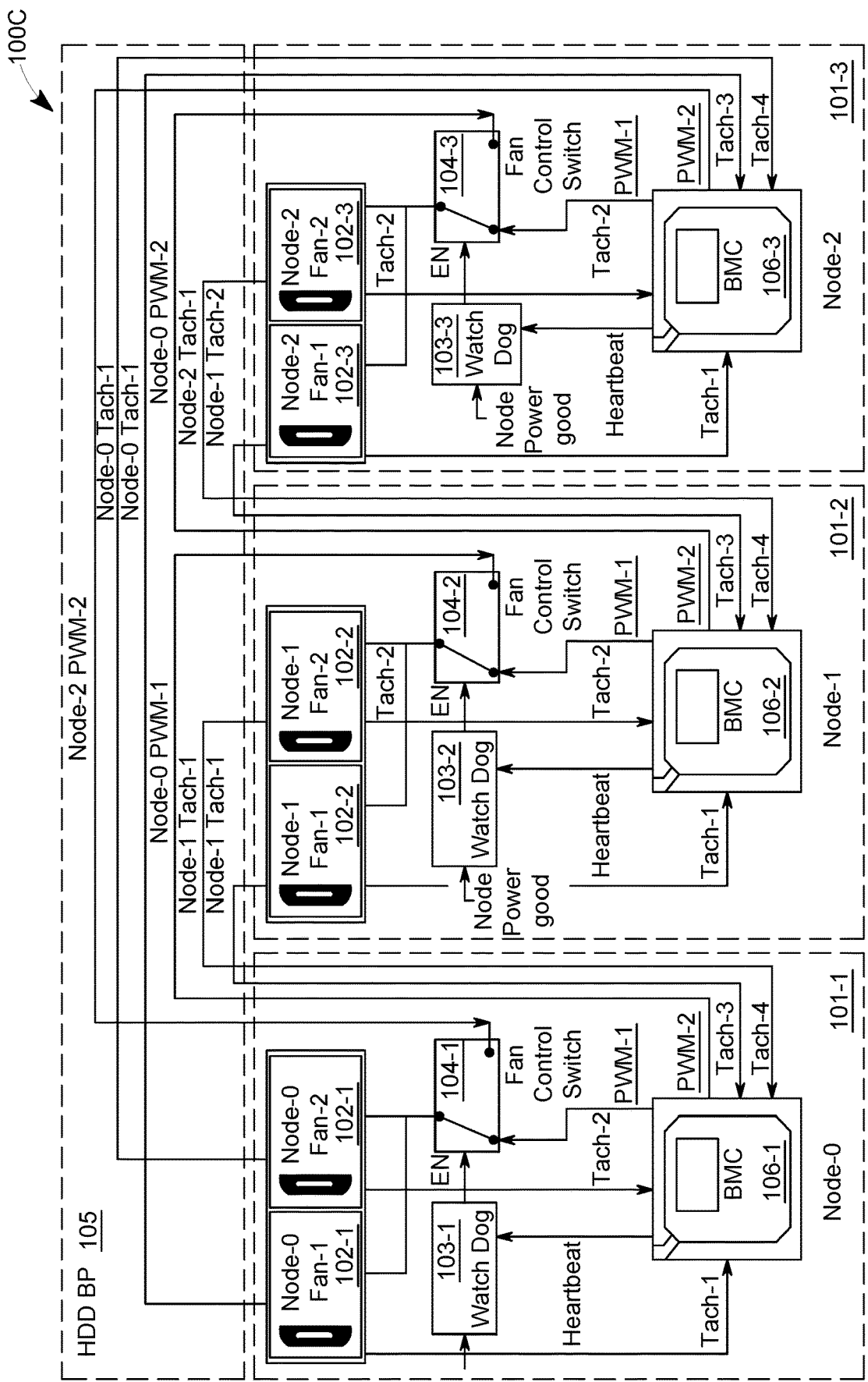
FIG. 1C is a schematic block diagram illustrating three exemplary server systems in a rack system, each server system having a watch dog circuit and a fan control switch, in accordance with an implementation of the present disclosure.

FIG. 1C is a schematic block diagram illustrating three exemplary server systems in a rack system 100C, each server system having a watch dog circuit and a fan control switch, in accordance with an implementation of the present disclosure. In this example, the system 100C comprises a backplane 105 and three server systems 101-1, 101-2 and 101-3. Each server system comprises one or more cooling fans (e.g., 102-1, 102-2 and 102-3), a watch dog circuit (e.g., 103-1, 103-2 and 103-3), a fan control switch (e.g., 104-1, 104-2 and 104-3), and a BMC (e.g., 106-1, 106-2 and 106-3). Each BMC of the server systems (e.g., 101-1, 101-2 or 101-3) is connected to one or more cooling fans of a corresponding server system via a fan control switch and also connected to one or more cooling fans of a neighboring server system via the backplane 105 and a fan control switch of the neighboring server system.

In this example, BMC (e.g., 106-1, 106-2 or 106-3) of a specific server system in the rack system 100C can receive status information (e.g., fan rotor status of each cooling fan) of one or more cooling fans of the specific server system, and also status information of one or more cooling fans of a neighboring server system. The BMC of a specific server system can also receive temperature information (e.g., temperature of CPU, HDD or BMC) of the specific server system. In an event that the fan control switch of the specific server system is enabled to an internal mode, the BMC can control fan speeds of one or more cooling fans on the specific server system based at least upon received temperature information.

In an event that a fan control switch of a neighboring server system is enabled to an external mode, the BMC may further receive temperature information of (e.g., temperature of CPU, HDD, or BMC) of the neighboring server system. The BMC can control fan speeds of the one or more cooling fans of the neighboring server system based at least upon received temperature information of the neighboring server system. In some examples, the BMC can control fan speeds of one or more cooling fans of the neighboring server system according to default or predetermined parameters.

Figure 1D:
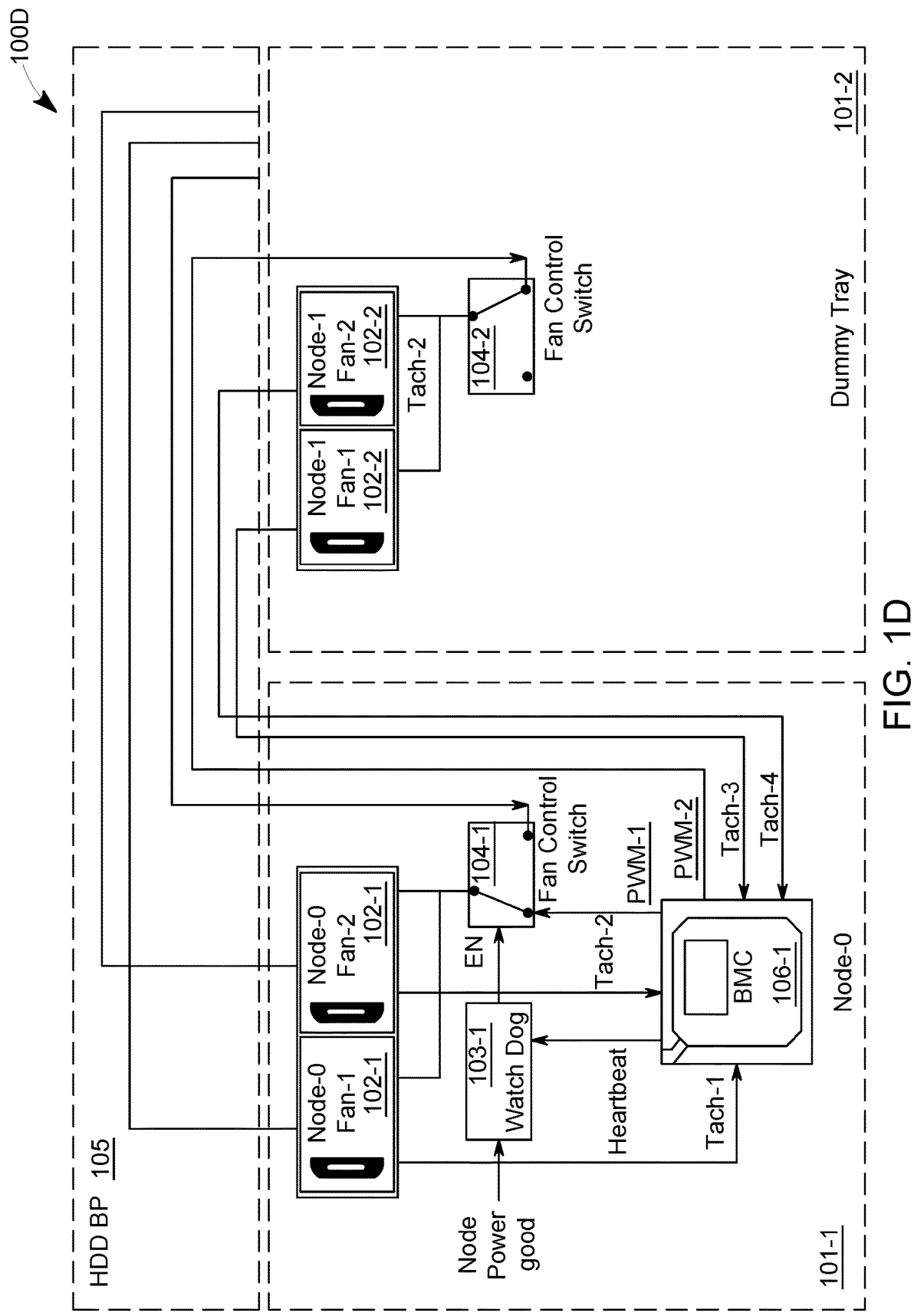
FIG. 1D is a schematic block diagram illustrating an exemplary server system and an exemplary dummy tray in a rack system, the exemplary server system having a watch dog circuit and a fan control switch, in accordance with an implementation of the present disclosure.

FIG. 1D is a schematic block diagram illustrating an exemplary server system and an exemplary dummy tray in a rack system 100E, the exemplary server system having a watch dog circuit and a fan control switch, in accordance with an implementation of the present disclosure. In this example, the system 100E comprises a backplane 105, a server system 101-1, and a dummy tray 101-2. The server system 101-1 comprises one or more cooling fans 102-1, a watch dog circuit 103-1, a fan control switch 104-1, and a BMC 106-1. The BMC 106-1 is connected to one or more cooling fans 102-1 via the fan control switch 104-1 and also connected to one or more cooling fans 102-2 of the dummy tray 101-2 via the backplane 105 and a fan control switch 104-2 of the dummy tray 101-2.

In this example, BMC 106-1 can receive status information (e.g., fan rotor status of each cooling fan) of one or more cooling fans 102-1, and also status information of one or more cooling fans 102-2 of the dummy tray 101-2. The BMC 106-1 can also receive temperature information (e.g., temperature of CPU or BMC) of the specific server system 101-1. In an event that the fan control switch 104-1 is enabled to an internal mode, the BMC 106-1 can control fan speeds of the one or more cooling fans 102-1 based at least upon received temperature information.

In some examples, the fan control switch 104-2 of the dummy tray 101-2 may be automatically enabled to an external mode in response to detecting no server system inside the dummy tray 101-2. The BMC 106-1 may further receive temperature information of the dummy tray 101-2. The BMC 106-1 can control fan speeds of the one or more cooling fans 102-2 of the dummy tray 101-2 based at least upon received temperature information of the dummy tray 101-2. In some examples, the BMC 106-1 can control fan speeds of the one or more cooling fans 102-2 of the dummy tray 101-2 according to default or predetermined parameters.

Overall, the present disclosure is advantageous over conventional solutions. In a conventional BBU system, a chassis manager controller (CM) is typically used to control fans inside a rack system. The CM receives temperature information from each node in the rack system and then control fan speeds of the fans. The present disclosure provides a more efficient fan control scheme inside a rack system. The CM is eliminated in rack systems implementing the present disclosure. Cost and board space can be saved. In addition, the present disclosure allows fan speed control for an individual node in the rack system and improves reliability of fan speed control schemes by enabling redundant fan speed controls for fans in each node of the rack system.

Figure 1E:
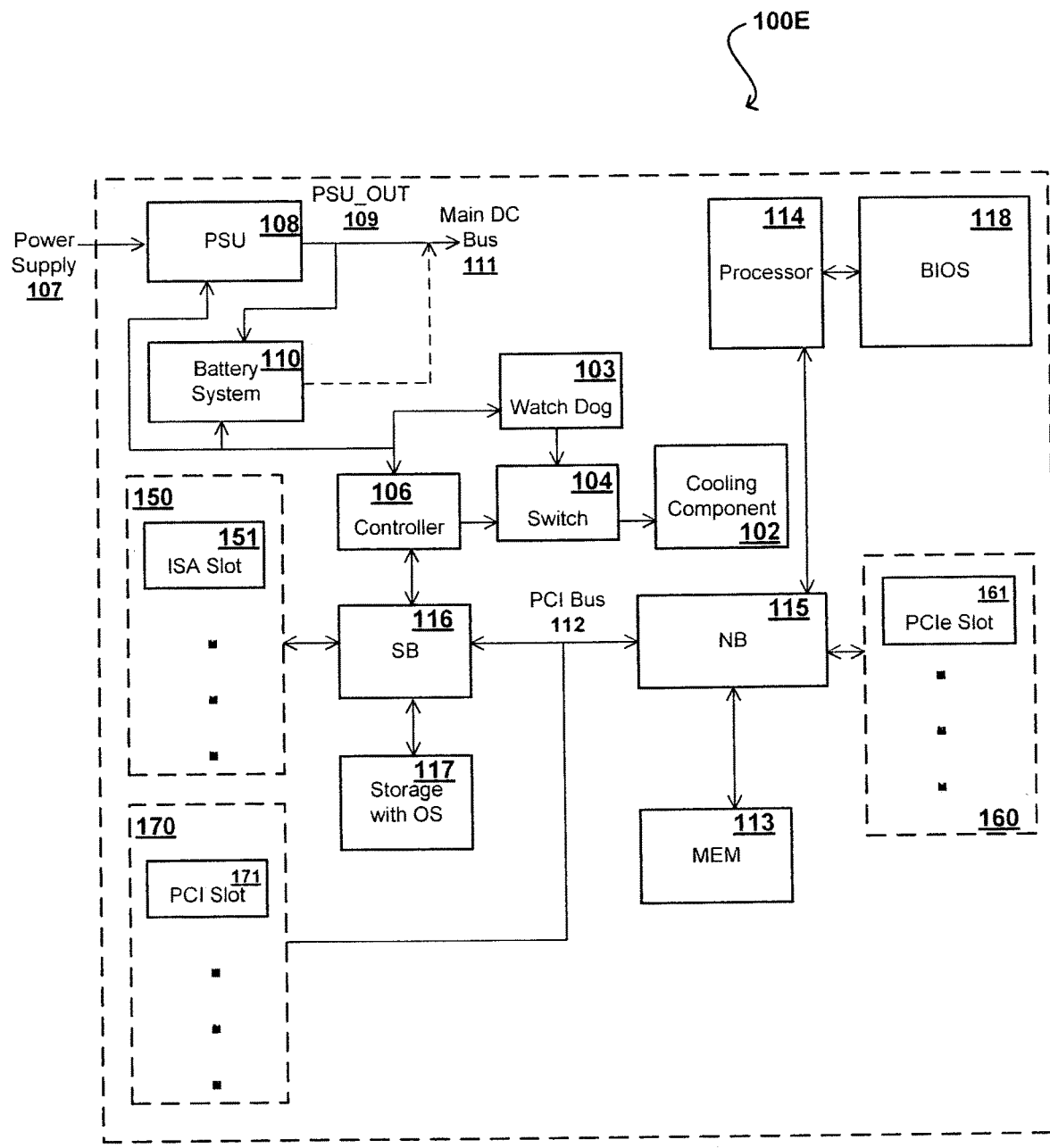
FIG. 1E is a schematic block diagram illustrating an exemplary system with a watch dog circuit and a fan control switch, in accordance with an implementation of the present disclosure.

FIG. 1E is a schematic block diagram illustrating an exemplary system 100E with a watch dog circuit and a fan control switch, in accordance with an implementation of the present disclosure. In this example, the server system 100E includes at least one microprocessor or processor 114, one or more cooling components 102, a main memory (MEM) 113, a battery system 110, and at least one power supply unit (PSU) 108 that receives an AC power from an AC power supply 107 and supply power to various components of the server system 100E, such as the processor 114, the battery system 110, north bridge (NB) logic 115, PCIe slots 160, south bridge (SB) logic 116, storage device 117, BIOS 118, ISA slots 150, PCI slots 170, a watch dog circuit 103, a cooling control switch 104, and a controller 106. After being powered on, the server system 100E is configured to load a software application from memory, computer storage device, or an external storage device to perform various operations. The storage device 117 is structured into logical blocks that are available to an operating system and applications of the server system 100E and configured to retain server data even when the server system 100E is powered off.

The battery system 110 is configured to supply power to the server system 100E in an event that either the power supply 107 or the at least one PSU 108 has failed. The memory 113 can be coupled to the processor 114 via the NB logic 115. The memory 113 may include, but is not limited to, dynamic random access memory (DRAM), double data rate DRAM (DDR DRAM), static RAM (SRAM), or other types of suitable memory. The memory 113 can be configured to store BIOS data of the server system 100E. In some configurations, BIOS data can be stored on the storage device 117.

The BIOS 118 can be any program instructions or firmware configured to initiate and identify various components of the server systems 100E. The BIOS 118 is an important system component that is responsible for initializing and testing hardware components of the server system 100E. The BIOS can provide an abstraction layer for the hardware components thereby providing a consistent way for applications and operating systems to interact with a peripheral device such as a keyboard, a display, and other input/output devices.

In some configurations, the BIOS 118 can run a system check prior to booting up an operating system (OS), e.g., the Microsoft Windows® OS, the Linux® OS, or any operating system, on a corresponding server system. The system check is a diagnostic system examination executed during initialization of the corresponding server system. An example of system check includes a Power-On Self-Test (POST). The BIOS can handle major functions of POST and may offload some duties to other programs designed to initialize specific peripheral devices (e.g., video and small computer system interface (SCSI) initialization). The major functions of POST may include: verifying CPU registers and the integrity of the BIOS code, checking basic components, examining system main memory, and passing control to other specialized BIOS extension. In some configurations, the BIOS may also handle additional POST's functions including: discovering, initializing, and cataloging all system buses and devices, providing a user interface for updating system's configuration, and constructing a system environment required by the operating system.

In system 100E, the storage device 117 can be any storage medium configured to store program instructions or data for a period of time. The storage device can be a shared memory between the controller 106 and processor 114. In some configurations, the storage device can be an independent storage device. The storage device can be a flash drive, a random access memory (RAM), a non-volatile random-access memory (NVRAM), a read-only memory, or an electrically erasable programmable read-only memory (EEPROM). The storage device is configured to store the system configurations such as BIOS data.

The processor 114 can be a central processing unit (CPU) configured to execute program instructions for specific functions. For example, during a booting process, the processor can access BIOS data stored in the storage device 117 and execute the BIOS 118 to initialize the server system 100E. After the booting process, the processor 114 can execute an operating system in order to perform and manage specific tasks for the server system 100E.

In some configurations, the processor 114 can be multi-core processors, each of which is coupled together through a CPU bus connected to the NB logic 115. In some configurations, the NB logic 115 can be integrated into the processor 114. The NB logic 115 can also be connected to a plurality of peripheral component interconnect express (PCIe) slots 160 and an SB logic 116 (optional). The plurality of PCIe slots 160 can be used for connections and buses such as PCI Express x1, USB 2.0, SMBus, SIM card, future extension for another PCIe lane, 1.5 V and 3.3 V power, and wires to diagnostics LEDs on the server system 100E's chassis.

In system 100E, the NB logic 115 and the SB logic 116 are connected by a peripheral component interconnect (PCI) Bus 112. The PCI Bus 112 can support function on the processor 114 but in a standardized format that is independent of any of the processor 114's native buses. The PCI Bus 112 can be further connected to a plurality of PCI slots 170 (e.g., a PCI slot 171). Devices connect to the PCI Bus 112 may appear to a bus controller (not shown) to be connected directly to a CPU bus, assigned addresses in the processor 114's address space, and synchronized to a single bus clock. PCI cards that can be used in the plurality of PCI slots 170 include, but are not limited to, network interface cards (NICs), sound cards, modems, TV tuner cards, disk controllers, video cards, small computer system interface (SCSI) adapters, and personal computer memory card international association (PCMCIA) cards.

The SB logic 116 can couple the PCI Bus 112 to a plurality of expansion cards or ISA slots 150 (e.g., an ISA slot 151) via an expansion bus. The expansion bus can be a bus used for communications between the SB logic 116 and peripheral devices, and may include, but is not limited to, an industry standard architecture (ISA) bus, PC/104 bus, low pin count bus, extended ISA (EISA) bus, universal serial bus (USB), integrated drive electronics (IDE) bus, or any other suitable bus that can be used for data communications for peripheral devices.

In system 100E, the SB logic 116 is further coupled to the controller 106 that is connected to the at least one PSU 102. In some implementations, the controller 106 can be a baseboard management controller (BMC), rack management controller (RMC), or other types of service controllers that are independent from a main central processing unit (e.g., the processor 114) can be used to perform functions disclosed herein.

In this example, the watch dog circuit 103 can monitor health of the controller 106, and, in response to determining that the controller 106 has failed, enable the cooling control switch 104 to an external mode and allow a controller of a neighboring server system in the same rack system to control the cooling component 102. For example, the watch dog circuit 103 can receive heartbeat signals from the controller 106. In response to determining that no heart beat signal has been received within a predetermined time period, the watch dog circuit 103 can determine that the controller 106 has failed and then enable the cooling control switch 104 to an external mode to allow a controller of a neighboring server system to control the cooling component 102.

In some implementations, the watch dog circuit 103 can actively monitor health of the controller 106. In an event that the controller 106 acts abnormally, the watch dog circuit 103 can determine that the controller 106 has failed and then enable the fan control switch of the specific server system to an external mode.

In some configurations, the controller 106 and the watch dog circuit 103 are both coupled to at least one PSU 108 and can receive status information of the power supply 107 and PSU 108 from the at least one PSU 102. For example, the controller 106 and the watch dog circuit 103 can receive voltage, current and temperature data from the at least one PSU 102. The watch dog circuit 103 enables the cooling control switch 104 to an external mode only if the AC power supply 107 and the PSU 108 are okay.

Based upon received data, the controller 106 can manage operations of the at least one PSU 102. For example, the controller 106 can power on or off the at least one PSU 102, or power on some of the at least one PSU 108 while power off the remaining PSU. In some examples, the controller 106 can communicate with the at least one PSU 108 via a SMBus, I2C, or PMBus.

The controller 106 can receive status information (e.g., status of each cooling component) of the cooling component 102 and temperature information of (e.g., temperature of processor 114, storage 117, memory 113 or controller 106) of the server system 100E. In an event that the cooling control switch 104 is enabled to an internal mode, the controller 106 can control the cooling component 102 based at least upon received temperature information.

In some examples, the controller 106 can further receive status information (e.g., status of each cooling component) of a cooling component and temperature information of (e.g., temperature of processor, storage, memory or controller) of a neighboring server system (not shown). In an event that a fan control switch of the neighboring server system is enabled to an external mode, the controller 106 can control the cooling component of the neighboring server system based at least upon received status information of the cooling component and/or temperature information of the neighboring server system. In some other examples, the controller 106 can control the cooling component of the neighboring server system according to default or predetermined parameters.

In some configurations, the controller 106 can communicate with the processor 114 and the storage device 117 via Intelligent Platform Management Interface (IPMI) messages using Intelligent Platform Management Bus/Bridge (IPMB). IPMB is an enhanced implementation of I²C bus and is a message-based, hardware-level basic interface specification.

In some implementations, the controller 106 may be configured to monitor power supply patterns, temperature of server rack and/or datacenter, power outage warning(s) associated with the datacenter, processing demands, and components and/or connection status of the server system 100E. Based at least upon potential/anticipated AC power outrage, the controller 106 may be configured to transfer processes on the server system 100E to other server systems that are not affected by the potential/anticipated AC power outrage, and also prepare the battery system 110 to be ready to supply power to the server system 100E.

Although only certain components are shown within the exemplary systems 100A, 100B, 100C, 100D and 100E in FIGS. 1A, 1B, 1C, 1D and 1E, respectively, various types of electronic or computing components that are capable of processing or storing data, or receiving or transmitting signals, can also be included in the exemplary systems 100A, 100B, 100C, 100D and 100E. Further, the electronic or computing components in the exemplary systems 100A, 100B, 100C, 100D and 100E can be configured to execute various types of application and/or can use various types of operating systems. These operating systems can include, but are not limited to, Android, Berkeley Software Distribution (BSD), iPhone OS (iOS), Linux, OS X, Unix-like Real-time Operating System (e.g., QNX), Microsoft Windows, Window Phone, and IBM z/OS.

Depending on the desired implementation for the exemplary systems 100A, 100B, 100C, 100D and 100E, a variety of networking and messaging protocols can be used, including but not limited to TCP/IP, open systems interconnection (OSI), file transfer protocol (FTP), universal plug and play (UpnP), network file system (NFS), common internet file system (CIFS), AppleTalk etc. As would be appreciated by those skilled in the art, the exemplary systems 100A, 100B, 100C, 100D and 100E illustrated in FIGS. 1A, 1B, 1C, 1D and 1E are used for purposes of explanation. Therefore, a network system can be implemented with many variations, as appropriate, yet still provide a configuration of network platform in accordance with various examples of the present disclosure.

In exemplary configurations of FIGS. 1A, 1B, 1C, 1D and 1E, the exemplary systems 100A, 100B, 100C, 100D and 100E can also include one or more wireless components operable to communicate with one or more electronic devices within a computing range of the particular wireless channel. The wireless channel can be any appropriate channel used to enable devices to communicate wirelessly, such as Bluetooth, cellular, NFC, or Wi-Fi channels. It should be understood that the device can have one or more conventional wired communications connections, as known in the art. Various other elements and/or combinations are possible as well within the scope of various examples.

Figure 2A:
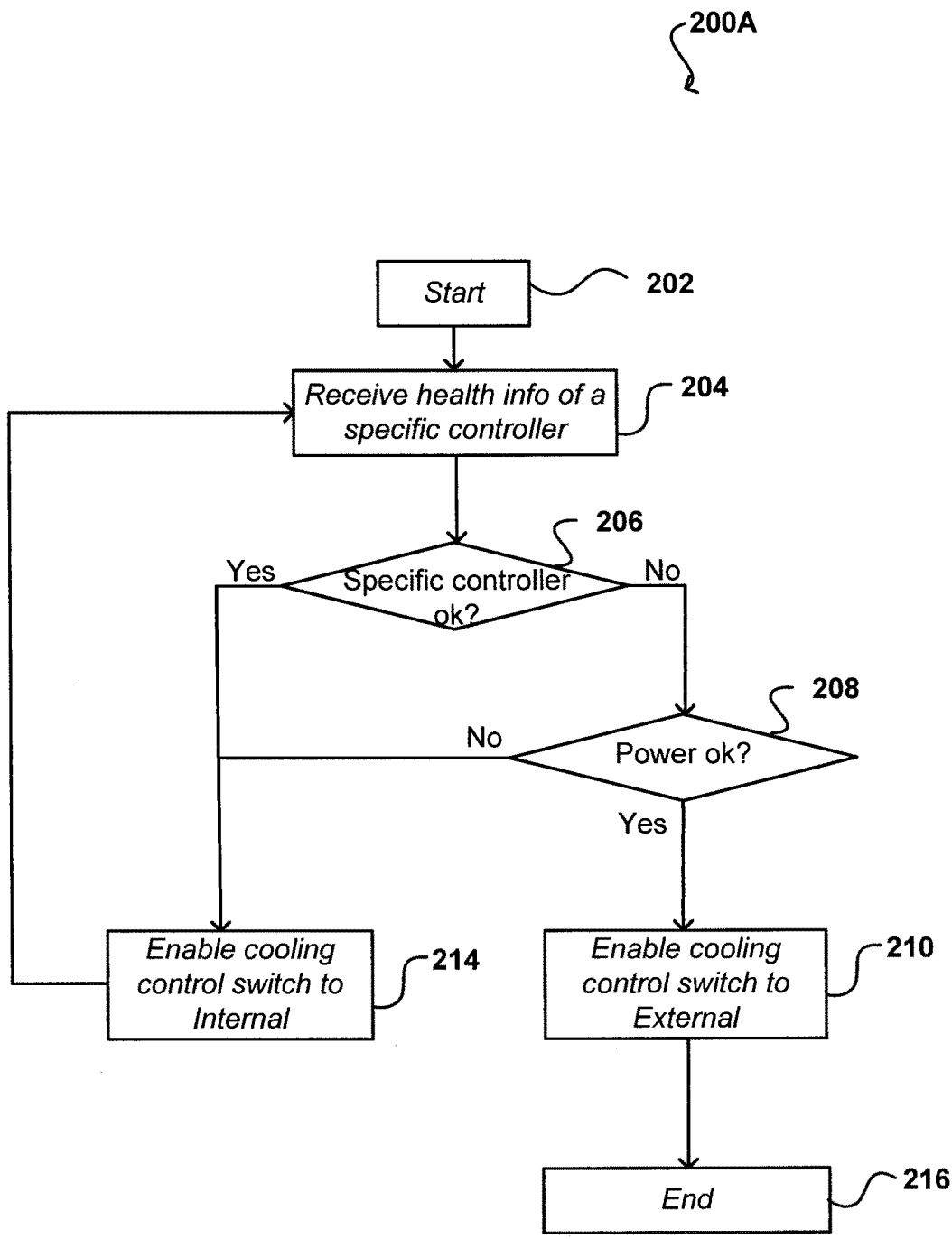
FIGS. 2A and 2B illustrates exemplary methods of managing one or more cooling devices in a rack system in accordance with an implementation of the present technology.

FIG. 2A illustrates an exemplary method 200A of managing one or more cooling devices in a rack system in accordance with an implementation of the present technology. It should be understood that the exemplary method 200A is presented solely for illustrative purposes and that in other methods in accordance with the present disclosure can include additional, fewer, or alternative steps performed in similar or alternative orders, or in parallel. The exemplary method 200A starts with step 202. At step 204, a watch dog circuit can receive health information of a specific controller (e.g., BMC or processor) of a server system in the rack system, as illustrated in FIGS. 1A-1D. In some examples, the watch dog circuit can receive heartbeat signals from the specific controller. In some examples, the watch dog circuit can actively test health of the specific controller.

At step 206, the watch dog circuit can determine whether the specific controller is ok, as illustrated in FIGS. 1A-1D. The watch dog circuit can further receive status information of an AC power supply and a power supply unit (PSU) of the server system. In an event that the specific controller has failed, the watch dog circuit can further determine whether the AC power supply and the PSU are okay, at step 208.

At step 210, in an event that the specific controller has failed or irresponsive, and both the PSU and the AC power supply are okay, the watch dog circuit can enable a cooling control switch of the server system to an external mode, and further allow a different controller of a neighboring server system in the rack system to control one or more cooling components of the server system, as illustrated in FIGS. 1A-1D. The method 200A ends at step 216.

At step 214, in an event that the specific controller is ok, or either the PSU or the AC power supply has failed, the watch dog circuit can enable the cooling control switch of the server system to an internal mode, as illustrated in FIGS. 1A-1D. The method 200A then goes back to step 204.

Figure 2B:
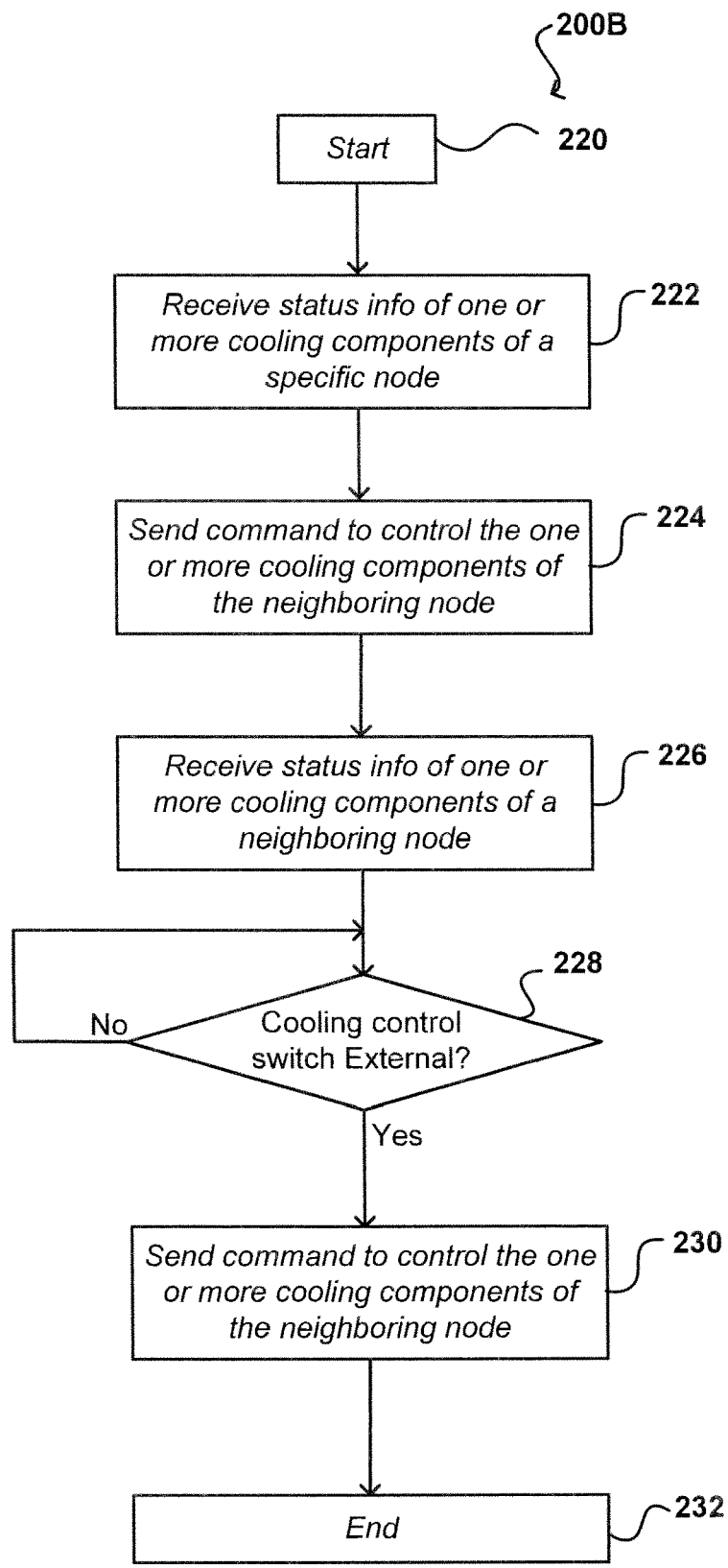

FIG. 2B illustrates another exemplary method 200B of managing one or more cooling devices in a rack system in accordance with an implementation of the present technology. It should be understood that the exemplary method 200A is presented solely for illustrative purposes and that in other methods in accordance with the present disclosure can include additional, fewer, or alternative steps performed in similar or alternative orders, or in parallel. The exemplary method 200 starts with step 220. At step 222, a controller (e.g., BMC or processor) of a specific node in the rack system can receive status information of one or more cooling components of the specific node, as illustrated in FIGS. 1A-1D. In some examples, the controller can further receive temperature information (e.g., temperature of CPU, specific controller, or hard drive (HDD)) of the specific node.

At step 224, the controller can control the one or more cooling components based at least upon the status information of one or more cooling components and/or the temperature information of the specific node, if a cooling control switch of the specific node is enabled in an internal mode, as illustrated in FIGS. 1A-1D.

At step 226, the controller can receive status information of one or more cooling components of a neighboring node in the rack system, as illustrated in FIGS. 1A-1D. In some examples, the controller can further receive temperature information (e.g., temperature of CPU, specific controller, or hard drive (HDD)) of the neighboring node.

At step 228, the controller can further determine whether a cooling control switch of the neighboring node is enabled to an external mode. In an event that the cooling control switch of the neighboring node is enabled to the external mode, the controller can, at step 230, control the one or more cooling components of the neighboring node by sending commands based at least upon the status information of the one or more cooling components of the neighboring node or the temperature information of the neighboring node. The method 200B ends at step 232.

The above discussion is meant to be illustrative of the principles and various examples of the present disclosure. Numerous variations and modifications will become apparent once the above disclosure is fully appreciated.

Terminologies

A computer network is a geographically distributed collection of nodes interconnected by communication links and segments for transporting data between endpoints, such as personal computers and workstations. Many types of networks are available, with the types ranging from local area networks (LANs) and wide area networks (WANs) to overlay and software-defined networks, such as virtual extensible local area networks (VXLANs).

LANs typically connect nodes over dedicated private communications links located in the same general physical location, such as a building or campus. WANs, on the other hand, typically connect geographically dispersed nodes over long-distance communications links, such as common carrier telephone lines, optical lightpaths, synchronous optical networks (SONET), or synchronous digital hierarchy (SDH) links. LANs and WANs can include layer 2 (L2) and/or layer 3 (L3) networks and devices.

The Internet is an example of a WAN that connects disparate networks throughout the world, providing global communication between nodes on various networks. The nodes typically communicate over the network by exchanging discrete frames or packets of data according to predefined protocols, such as the Transmission Control Protocol/Internet Protocol (TCP/IP). In this context, a protocol can refer to a set of rules defining how the nodes interact with each other. Computer networks can be further interconnected by an intermediate network node, such as a router, to extend the effective "size" of each network.

Overlay networks generally allow virtual networks to be created and layered over a physical network infrastructure. Overlay network protocols, such as Virtual Extensible LAN (VXLAN), Network Virtualization using Generic Routing Encapsulation (NVGRE), Network Virtualization Overlays (NVO3), and Stateless Transport Tunneling (STT), provide a traffic encapsulation scheme which allows network traffic to be carried across L2 and L3 networks over a logical tunnel. Such logical tunnels can be originated and terminated through virtual tunnel end points (VTEPs).

Moreover, overlay networks can include virtual segments, such as VXLAN segments in a VXLAN overlay network, which can include virtual L2 and/or L3 overlay networks over which VMs communicate. The virtual segments can be identified through a virtual network identifier (VNI), such as a VXLAN network identifier, which can specifically identify an associated virtual segment or domain.

Network virtualization allows hardware and software resources to be combined in a virtual network. For example, network virtualization can allow multiple numbers of VMs to be attached to the physical network via respective virtual LANs (VLANs). The VMs can be grouped according to their respective VLAN, and can communicate with other VMs as well as other devices on the internal or external network.

Network segments, such as physical or virtual segments, networks, devices, ports, physical or logical links, and/or traffic in general can be grouped into a bridge or flood domain. A bridge domain or flood domain can represent a broadcast domain, such as an L2 broadcast domain. A bridge domain or flood domain can include a single subnet, but can also include multiple subnets. Moreover, a bridge domain can be associated with a bridge domain interface on a network device, such as a switch. A bridge domain interface can be a logical interface which supports traffic between an L2 bridged network and an L3 routed network. In addition, a bridge domain interface can support internet protocol (IP) termination, VPN termination, address resolution handling, MAC addressing, etc. Both bridge domains and bridge domain interfaces can be identified by a same index or identifier.

Furthermore, endpoint groups (EPGs) can be used in a network for mapping applications to the network. In particular, EPGs can use a grouping of application endpoints in a network to apply connectivity and policy to the group of applications. EPGs can act as a container for buckets or collections of applications, or application components, and tiers for implementing forwarding and policy logic. EPGs also allow separation of network policy, security, and forwarding from addressing by instead using logical application boundaries.

Cloud computing can also be provided in one or more networks to provide computing services using shared resources. Cloud computing can generally include Internet-based computing in which computing resources are dynamically provisioned and allocated to client or user computers or other devices on-demand, from a collection of resources available via the network (e.g., "the cloud"). Cloud computing resources, for example, can include any type of resource, such as computing, storage, and network devices, virtual machines (VMs), etc. For instance, resources can include service devices (firewalls, deep packet inspectors, traffic monitors, load balancers, etc.), compute/processing devices (servers, CPU's, memory, brute force processing capability), storage devices (e.g., network attached storages, storage area network devices), etc. In addition, such resources can be used to support virtual networks, virtual machines (VM), databases, applications (Apps), etc.

Cloud computing resources can include a "private cloud," a "public cloud," and/or a "hybrid cloud." A "hybrid cloud" can be a cloud infrastructure composed of two or more clouds that inter-operate or federate through technology. In essence, a hybrid cloud is an interaction between private and public clouds where a private cloud joins a public cloud and utilizes public cloud resources in a secure and scalable manner. Cloud computing resources can also be provisioned via virtual networks in an overlay network, such as a VXLAN.

Figure 3:
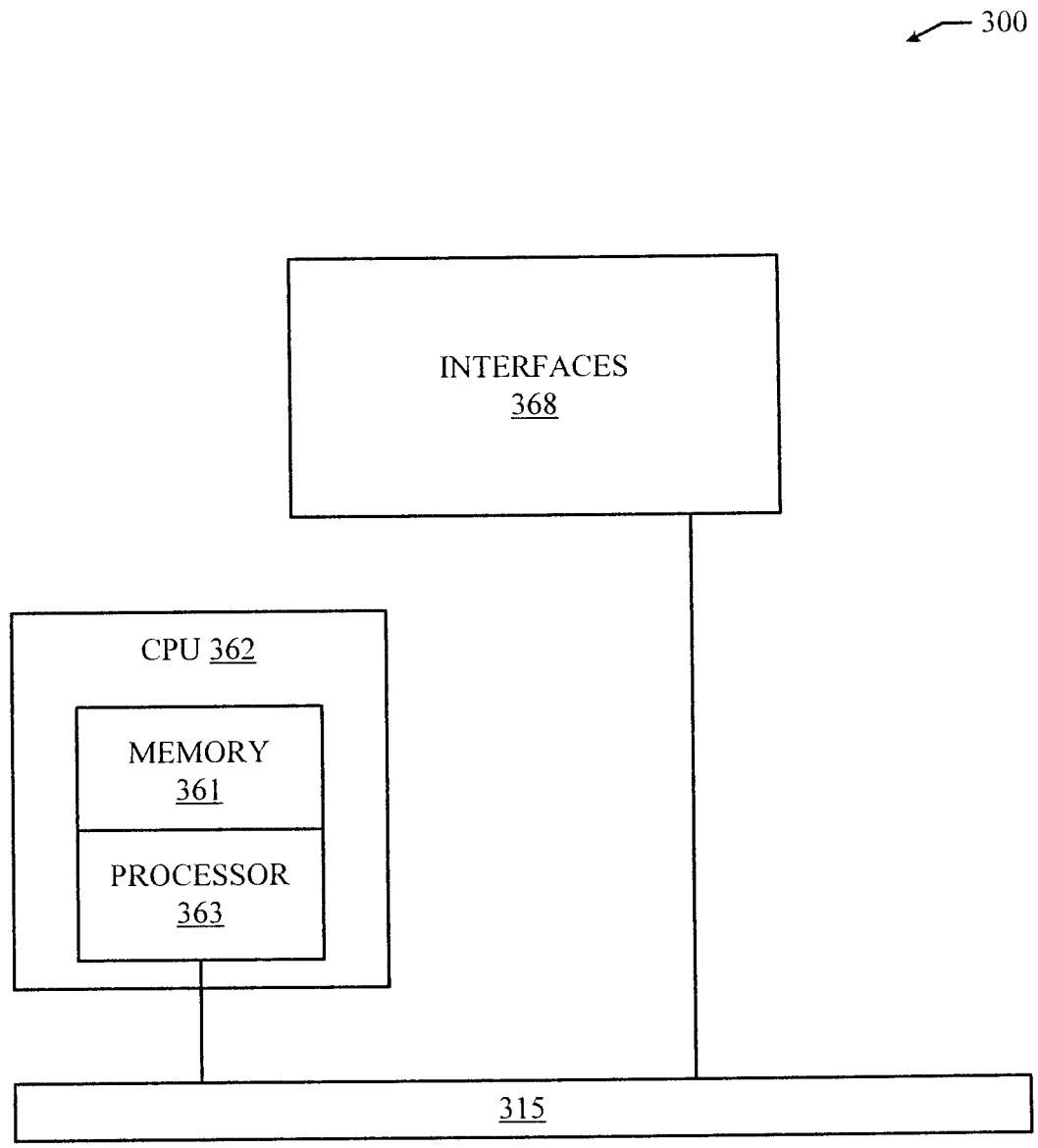
FIG. 3 illustrates an exemplary computing device in accordance with various implementations of the technology.
Figure 4:
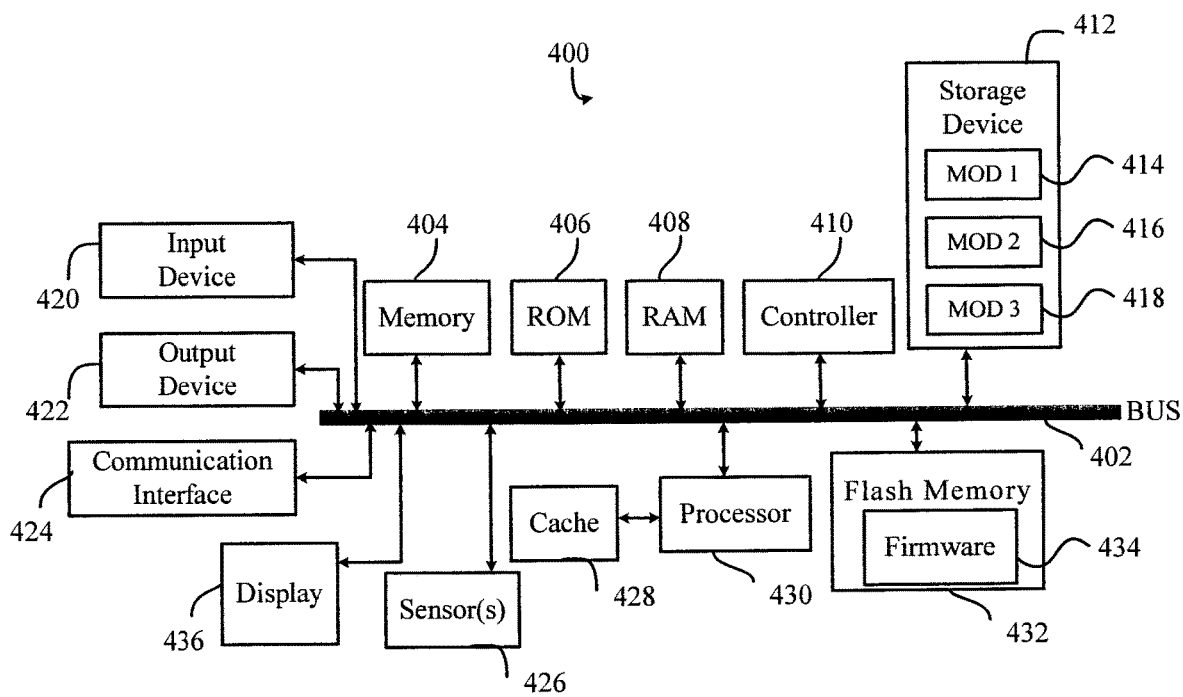
FIGS. 4 and 5 illustrate exemplary systems in accordance with various examples of the present technology.

In a network switch system, a lookup database can be maintained to keep track of routes between a number of end points attached to the switch system. However, end points can have various configurations and are associated with numerous tenants. These end-points can have various types of identifiers, e.g., IPv4, IPv6, or Layer-2. The lookup database has to be configured in different modes to handle different types of end-point identifiers. Some capacity of the lookup database is carved out to deal with different address types of incoming packets. Further, the lookup database on the network switch system is typically limited by 1K virtual routing and forwarding (VRFs). Therefore, an improved lookup algorithm is desired to handle various types of end-point identifiers. The disclosed technology addresses the need in the art for address lookups in a telecommunications network. Disclosed are systems, methods, and computer-readable storage media for unifying various types of end-point identifiers by mapping end-point identifiers to a uniform space and allowing different forms of lookups to be uniformly handled. A brief introductory description of example systems and networks, as illustrated in FIGS. 3 and 4, is disclosed herein. These variations shall be described herein as the various examples are set forth. The technology now turns to FIG. 3.

FIG. 3 illustrates an example computing device 300 suitable for implementing the present disclosure. Computing device 300 includes a master central processing unit (CPU) 362, interfaces 368, and a bus 315 (e.g., a PCI bus). When acting under the control of appropriate software or firmware, the CPU 362 is responsible for executing packet management, error detection, and/or routing functions, such as miscabling detection functions, for example. The CPU 362 preferably accomplishes all these functions under the control of software including an operating system and any appropriate applications software. CPU 362 can include one or more processors 363 such as a processor from the Motorola family of microprocessors or the MIPS family of microprocessors. In an alternative example, processor 363 is specially designed hardware for controlling the operations of the computing device 300. In a specific example, a memory 361 (such as non-volatile RAM and/or ROM) also forms part of CPU 362. However, there are many different ways in which memory could be coupled to the system.

The interfaces 368 are typically provided as interface cards (sometimes referred to as "line cards"). Generally, they control the sending and receiving of data packets over the network and sometimes support other peripherals used with the computing device 300. Among the interfaces that can be provided are Ethernet interfaces, frame relay interfaces, cable interfaces, DSL interfaces, token ring interfaces, and the like. In addition, various very high-speed interfaces can be provided such as fast token ring interfaces, wireless interfaces, Ethernet interfaces, Gigabit Ethernet interfaces, ATM interfaces, HSSI interfaces, POS interfaces, FDDI interfaces and the like. Generally, these interfaces can include ports appropriate for communication with the appropriate media. In some cases, they can also include an independent processor and, in some instances, volatile RAM. The independent processors can control such communications intensive tasks as packet switching, media control and management. By providing separate processors for the communications intensive tasks, these interfaces allow the master microprocessor 362 to efficiently perform routing computations, network diagnostics, security functions, etc.

Although the system shown in FIG. 3 is one specific computing device of the present disclosure, it is by no means the only network device architecture on which the present patent application can be implemented. For example, an architecture having a single processor that handles communications as well as routing computations, etc. is often used. Further, other types of interfaces and media could also be used with the router.

Regardless of the network device's configuration, it can employ one or more memories or memory modules (including memory 361) configured to store program instructions for the general-purpose network operations and mechanisms for roaming, route optimization and routing functions described herein. The program instructions can control the operation of an operating system and/or one or more applications, for example. The memory or memories can also be configured to store tables such as mobility binding, registration, and association tables, etc.

Figure 5:
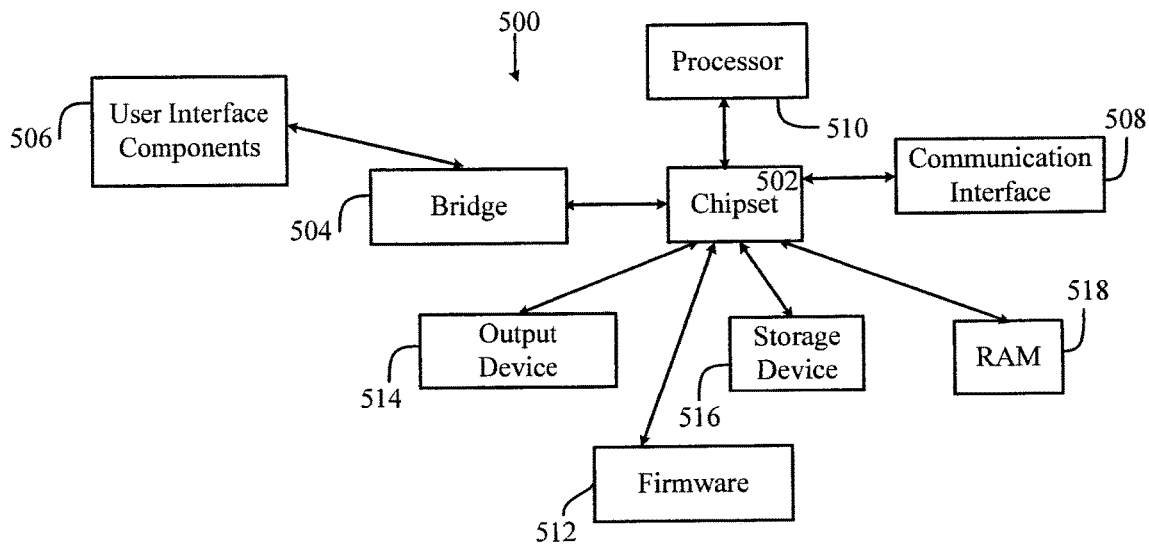

FIGS. 4 and 5 illustrate example system examples. The more appropriate embodiment will be apparent to those of ordinary skill in the art when practicing the present disclosure. Persons of ordinary skill in the art will also readily appreciate that other system examples are possible.

FIG. 4 illustrates a system bus computing system architecture 400 wherein the components of the system are in electrical communication with each other using a bus 402. Example system 400 includes a processing unit (CPU or processor) 430 and a system bus 402 that couples various system components including the system memory 404, such as read only memory (ROM) 406 and random access memory (RAM) 408, to the processor 430. The system 400 can include a cache of high-speed memory connected directly with, in close proximity to, or integrated as part of the processor 430. The system 400 can copy data from the memory 404 and/or the storage device 412 to the cache 428 for quick access by the processor 430. In this way, the cache can provide a performance boost that avoids processor 430 delays while waiting for data. These and other modules can control or be configured to control the processor 430 to perform various actions. Other system memory 404 may be available for use as well. The memory 404 can include multiple different types of memory with different performance characteristics. The processor 430 can include any general purpose processor and a hardware module or software module, such as module 1 414, module 2 416, and module 3 418 stored in storage device 412, configured to control the processor 430 as well as a special-purpose processor where software instructions are incorporated into the actual processor design. The processor 430 may essentially be a completely self-contained computing system, containing multiple cores or processors, a bus, memory controller, cache, etc. A multi-core processor may be symmetric or asymmetric.

To enable user interaction with the computing device 400, an input device 420 can represent any number of input mechanisms, such as a microphone for speech, a touch-sensitive screen for gesture or graphical input, keyboard, mouse, motion input, and so forth. An output device 422 can also be one or more of a number of output mechanisms known to those of skill in the art. In some instances, multimodal systems can enable a user to provide multiple types of input to communicate with the system 400. The communications interface 424 can generally govern and manage the user input and system output. There is no restriction on operating on any particular hardware arrangement and therefore the basic features here may easily be substituted for improved hardware or firmware arrangements as they are developed.

Storage device 412 is a non-volatile memory and can be a hard disk or other types of computer readable media which can store data that are accessible by a computer, such as magnetic cassettes, flash memory cards, solid state memory devices, digital versatile disks, cartridges, random access memories (RAMs) 408, read only memory (ROM) 406, and hybrids thereof.

The storage device 412 can include software modules 414, 416, 418 for controlling the processor 430. Other hardware or software modules are contemplated. The storage device 412 can be connected to the system bus 402. In one aspect, a hardware module that performs a particular function can include the software component stored in a computer-readable medium in connection with the necessary hardware components, such as the processor 430, bus 402, display 436, and so forth, to carry out the function.

The controller 410 can be a specialized microcontroller or processor on the system 400, such as a BMC (baseboard management controller). In some cases, the controller 410 can be part of an Intelligent Platform Management Interface (IPMI). Moreover, in some cases, the controller 410 can be embedded on a motherboard or main circuit board of the system 400. The controller 410 can manage the interface between system management software and platform hardware. The controller 410 can also communicate with various system devices and components (internal and/or external), such as controllers or peripheral components, as further described below.

The controller 410 can generate specific responses to notifications, alerts, and/or events and communicate with remote devices or components (e.g., electronic mail message, network message, etc.), generate an instruction or command for automatic hardware recovery procedures, etc. An administrator can also remotely communicate with the controller 410 to initiate or conduct specific hardware recovery procedures or operations, as further described below.

Different types of sensors (e.g., sensors 426) on the system 400 can report to the controller 410 on parameters such as cooling fan speeds, power status, operating system (OS) status, hardware status, and so forth. The controller 410 can also include a system event log controller and/or storage for managing and maintaining events, alerts, and notifications received by the controller 410. For example, the controller 410 or a system event log controller can receive alerts or notifications from one or more devices and components and maintain the alerts or notifications in a system event log storage component.

Flash memory 432 can be an electronic non-volatile computer storage medium or chip which can be used by the system 400 for storage and/or data transfer. The flash memory 432 can be electrically erased and/or reprogrammed. Flash memory 432 can include erasable programmable read-only memory (EPROM), electrically erasable programmable read-only memory (EEPROM), ROM, NVRAM, or complementary metal-oxide semiconductor (CMOS), for example. The flash memory 432 can store the firmware 434 executed by the system 400 when the system 400 is first powered on, along with a set of configurations specified for the firmware 434. The flash memory 432 can also store configurations used by the firmware 434.

The firmware 434 can include a Basic Input/Output System or its successors or equivalents, such as an Extensible Firmware Interface (EFI) or Unified Extensible Firmware Interface (UEFI). The firmware 434 can be loaded and executed as a sequence program each time the system 400 is started. The firmware 434 can recognize, initialize, and test hardware present in the system 400 based on the set of configurations. The firmware 434 can perform a self-test, such as a Power-on-Self-Test (POST), on the system 400. This self-test can test functionality of various hardware components such as hard disk drives, optical reading devices, cooling devices, memory modules, expansion cards and the like. The firmware 434 can address and allocate an area in the memory 404, ROM 406, RAM 408, and/or storage device 412, to store an operating system (OS). The firmware 434 can load a boot loader and/or OS, and give control of the system 400 to the OS.

The firmware 434 of the system 400 can include a firmware configuration that defines how the firmware 434 controls various hardware components in the system 400. The firmware configuration can determine the order in which the various hardware components in the system 400 are started. The firmware 434 can provide an interface, such as an UEFI, that allows a variety of different parameters to be set, which can be different from parameters in a firmware default configuration. For example, a user (e.g., an administrator) can use the firmware 434 to specify clock and bus speeds, define what peripherals are attached to the system 400, set monitoring of health (e.g., fan speeds and CPU temperature limits), and/or provide a variety of other parameters that affect overall performance and power usage of the system 400.

While firmware 434 is illustrated as being stored in the flash memory 432, one of ordinary skill in the art will readily recognize that the firmware 434 can be stored in other memory components, such as memory 404 or ROM 406, for example. However, firmware 434 is illustrated as being stored in the flash memory 432 as a non-limiting example for explanation purposes.

System 400 can include one or more sensors 426. The one or more sensors 426 can include, for example, one or more temperature sensors, thermal sensors, oxygen sensors, chemical sensors, noise sensors, heat sensors, current sensors, voltage detectors, air flow sensors, flow sensors, infrared thermometers, heat flux sensors, thermometers, pyrometers, etc. The one or more sensors 426 can communicate with the processor, cache 428, flash memory 432, communications interface 424, memory 404, ROM 406, RAM 408, controller 410, and storage device 412, via the bus 402, for example. The one or more sensors 426 can also communicate with other components in the system via one or more different means, such as inter-integrated circuit (I2C), general purpose output (GPO), and the like.

FIG. 5 illustrates an example computer system 500 having a chipset architecture that can be used in executing the described method(s) or operations, and generating and displaying a graphical user interface (GUI). Computer system 500 can include computer hardware, software, and firmware that can be used to implement the disclosed technology. System 500 can include a processor 510, representative of any number of physically and/or logically distinct resources capable of executing software, firmware, and hardware configured to perform identified computations. Processor 510 can communicate with a chipset 502 that can control input to and output from processor 510. In this example, chipset 502 outputs information to output device 514, such as a display, and can read and write information to storage device 516, which can include magnetic media, and solid state media, for example. Chipset 502 can also read data from and write data to RAM 518. A bridge 504 for interfacing with a variety of user interface components 506 can be provided for interfacing with chipset 502. Such user interface components 506 can include a keyboard, a microphone, touch detection and processing circuitry, a pointing device, such as a mouse, and so on. In general, inputs to system 500 can come from any of a variety of sources, machine generated and/or human generated.

Chipset 502 can also interface with one or more communication interfaces 508 that can have different physical interfaces. Such communication interfaces can include interfaces for wired and wireless local area networks, for broadband wireless networks, as well as personal area networks. Some applications of the methods for generating, displaying, and using the GUI disclosed herein can include receiving ordered datasets over the physical interface or be generated by the machine itself by processor 510 analyzing data stored in storage 516 or 518. Further, the machine can receive inputs from a user via user interface components 506 and execute appropriate functions, such as browsing functions by interpreting these inputs using processor 510.

Moreover, chipset 502 can also communicate with firmware 512, which can be executed by the computer system 500 when powering on. The firmware 512 can recognize, initialize, and test hardware present in the computer system 500 based on a set of firmware configurations. The firmware 512 can perform a self-test, such as a POST, on the system 500. The self-test can test the functionality of the various hardware components 502-518. The firmware 512 can address and allocate an area in the memory 518 to store an OS. The firmware 512 can load a boot loader and/or OS, and give control of the system 500 to the OS. In some cases, the firmware 512 can communicate with the hardware components 502-510 and 514-518. Here, the firmware 512 can communicate with the hardware components 502-510 and 514-518 through the chipset 502 and/or through one or more other components. In some cases, the firmware 512 can communicate directly with the hardware components 502-510 and 514-518.

It can be appreciated that example systems 300, 400 and 500 can have more than one processor (e.g., 363, 430, 510) or be part of a group or cluster of computing devices networked together to provide greater processing capability.

For clarity of explanation, in some instances the present disclosure may be presented as including individual functional blocks including functional blocks including devices, device components, steps or routines in a method embodied in software, or combinations of hardware and software.

In some examples the computer-readable storage devices, mediums, and memories can include a cable or wireless signal containing a bit stream and the like. However, when mentioned, non-transitory computer-readable storage media expressly exclude media such as energy, carrier signals, electromagnetic waves, and signals per se.

Methods according to the above-described examples can be implemented using computer-executable instructions that are stored or otherwise available from computer readable media. Such instructions can include, for example, instructions and data which cause or otherwise configure a general purpose computer, special purpose computer, or special purpose processing device to perform a certain function or group of functions. Portions of computer resources used can be accessible over a network. The computer executable instructions may be, for example, binaries, intermediate format instructions such as assembly language, firmware, or source code. Examples of computer-readable media that may be used to store instructions, information used, and/or information created during methods according to described examples include magnetic or optical disks, flash memory, USB devices provided with non-volatile memory, networked storage devices, and so on.

Devices implementing methods according to these disclosures can include hardware, firmware and/or software, and can take any of a variety of form factors. Typical examples of such form factors include laptops, smart phones, small form factor personal computers, personal digital assistants, rackmount devices, standalone devices, and so on. Functionality described herein also can be embodied in peripherals or add-in cards. Such functionality can also be implemented on a circuit board among different chips or different processes executing in a single device, by way of further example.

The instructions, media for conveying such instructions, computing resources for executing them, and other structures for supporting such computing resources are means for providing the functions described herein.

Various aspects of the present disclosure provide systems and methods for controlling one or more cooling components of a node using a cooling control switch and a specific controller (e.g., BMC or a specific processor) of the node. While specific examples have been cited above showing how the optional operation can be employed in different instructions, other examples can incorporate the optional operation into different instructions. For clarity of explanation, in some instances the present disclosure can be presented as including individual functional blocks including functional blocks including devices, device components, steps or routines in a method embodied in software, or combinations of hardware and software.

The various examples can be further implemented in a wide variety of operating environments, which in some cases can include one or more server computers, user computers or computing devices which can be used to operate any of a number of applications. User or client devices can include any of a number of general purpose personal computers, such as desktop or laptop computers running a standard operating system, as well as cellular, wireless and handheld devices running mobile software and capable of supporting a number of networking and messaging protocols. Such a system can also include a number of workstations running any of a variety of commercially-available operating systems and other known applications for purposes such as development and database management. These devices can also include other electronic devices, such as dummy terminals, thin-clients, gaming systems and other devices capable of communicating via a network.

To the extent examples, or portions thereof, are implemented in hardware, the present patent application can be implemented with any or a combination of the following technologies: a discrete logic circuit(s) having logic gates for implementing logic functions upon data signals, an application specific integrated circuit (ASIC) having appropriate combinational logic gates, programmable hardware such as a programmable gate array(s) (PGA), a field programmable gate array (FPGA), etc.

Most examples utilize at least one network that would be familiar to those skilled in the art for supporting communications using any of a variety of commercially-available protocols, such as TCP/IP, OSI, FTP, UPnP, NFS, CIFS, AppleTalk etc. The network can be, for example, a local area network, a wide-area network, a virtual private network, the Internet, an intranet, an extranet, a public switched telephone network, an infrared network, a wireless network and any combination thereof.

Methods according to the above-described examples can be implemented using computer-executable instructions that are stored or otherwise available from computer readable media. Such instructions can include, for example, instructions and data which cause or otherwise configure a general purpose computer, special purpose computer, or special purpose processing device to perform a certain function or group of functions. Portions of computer resources used can be accessible over a network. The computer executable instructions can be, for example, binaries, intermediate format instructions such as assembly language, firmware, or source code. Examples of computer-readable media that can be used to store instructions, information used, and/or information created during methods according to described examples include magnetic or optical disks, flash memory, USB devices provided with non-volatile memory, networked storage devices, and so on.

Devices implementing methods according to these technologies can include hardware, firmware and/or software, and can take any of a variety of form factors. Typical examples of such form factors include server computers, laptops, smart phones, small form factor personal computers, personal digital assistants, and so on. Functionality described herein also can be embodied in peripherals or add-in cards. Such functionality can also be implemented on a circuit board among different chips or different processes executing in a single device, by way of further example.

In examples utilizing a Web server, the Web server can run any of a variety of server or mid-tier applications, including HTTP servers, FTP servers, CGI servers, data servers, Java servers and business application servers. The server(s) can also be capable of executing programs or scripts in response to requests from user devices, such as by executing one or more Web applications that can be implemented as one or more scripts or programs written in any programming language, such as Java®, C, C# or C++ or any scripting language, such as Perl, Python or TCL, as well as combinations thereof. The server(s) can also include database servers, including without limitation those commercially available from open market.

The server system can include a variety of data stores and other memory and storage media as discussed above. These can reside in a variety of locations, such as on a storage medium local to (and/or resident in) one or more of the computers or remote from any or all of the computers across the network. In a particular set of examples, the information can reside in a storage-area network (SAN) familiar to those skilled in the art. Similarly, any necessary files for performing the functions attributed to the computers, servers or other network devices can be stored locally and/or remotely, as appropriate. Where a system includes computerized devices, each such device can include hardware elements that can be electrically coupled via a bus, the elements including, for example, at least one central processing unit (CPU), at least one input device (e.g., a mouse, keyboard, controller, touch-sensitive display element or keypad) and at least one output device (e.g., a display device, printer or speaker). Such a system can also include one or more storage devices, such as disk drives, optical storage devices and solid-state storage devices such as random access memory (RAM) or read-only memory (ROM), as well as removable media devices, memory cards, flash cards, etc.

Such devices can also include a computer-readable storage media reader, a communications device (e.g., a modem, a network card (wireless or wired), an infrared computing device) and working memory as described above. The computer-readable storage media reader can be connected with, or configured to receive, a computer-readable storage medium representing remote, local, fixed and/or removable storage devices as well as storage media for temporarily and/or more permanently containing, storing, transmitting and retrieving computer-readable information. The system and various devices also typically will include a number of software applications, modules, services or other elements located within at least one working memory device, including an operating system and application programs such as a client application or Web browser. It should be appreciated that alternate examples can have numerous variations from that described above. For example, customized hardware might also be used and/or particular elements might be implemented in hardware, software (including portable software, such as applets) or both. Further, connection to other computing devices such as network input/output devices can be employed.

Storage media and computer readable media for containing code, or portions of code, can include any appropriate media known or used in the art, including storage media and computing media, such as but not limited to volatile and non-volatile, removable and non-removable media implemented in any method or technology for storage and/or transmission of information such as computer readable instructions, data structures, program modules or other data, including RAM, ROM, EPROM, EEPROM, flash memory or other memory technology, CD-ROM, digital versatile disk (DVD) or other optical storage, magnetic cassettes, magnetic tape, magnetic disk storage or other magnetic storage devices or any other medium which can be used to store the desired information and which can be accessed by a system device. Based on the technology and teachings provided herein, a person of ordinary skill in the art will appreciate other ways and/or methods to implement the various aspects of the present disclosure.

The specification and drawings are, accordingly, to be regarded in an illustrative rather than a restrictive sense. It will, however, be evident that various modifications and changes can be made thereunto without departing from the broader spirit and scope of the patent application as set forth in the claims.

What is claimed is:
1. A server-rack system, comprising:
a first server system comprising:
  one or more cooling components,
  a first cooling control switch coupled to the one or more cooling components of the first server system, the first cooling control switch configured to alternate between an internal mode and an external mode;
  a first controller configured to control the one or more cooling components of the first server system via a direct connection to the first cooling control switch, and
  a first watch dog circuit coupled to the first cooling control switch and the first controller, the first watch dog circuit configured to determine health of the first controller;
a second server system comprising:
  one or more cooling components, a second cooling control switch coupled to the one or more cooling components of the second server system, the second cooling control switch configured to alternate between an internal mode and an external mode;

a second controller configured to control the one or more cooling components of the second server system via a direct connection to the second cooling control switch, and a second watch dog circuit coupled to the second cooling control switch and the second controller, the second watch dog circuit configured to (i) determine health of the second controller and (ii) receive status information of an AC power supply and a power supply unit (PSU) of the second server system;

wherein when the first controller has failed, the first watch dog circuit of the first server system is further configured to enable the first cooling control switch to the external mode and allow the second controller of the second server system to control the one or more cooling components of the first server system via a direct connection to the first cooling control switch; and wherein when the second controller has failed and the status information indicates that the AC power supply and the PSU of the second server system have not failed, the second watch dog circuit of the second server system is configured to allow the first controller of the first server system to control the one or more cooling components of the second server system via a direct connection to the second cooling control switch.

2. The server-rack system of claim 1, wherein the first watch dog circuit is further configured to receive status information of an AC power supply and a power supply unit (PSU) of the first server system, and operable to enable the first cooling control switch to the external mode only if both the AC power supply and the PSU of the first server system have not failed.

3. The server-rack system of claim 1, wherein the first watch dog circuit is configured to determine the health of the first controller by receiving heartbeat signals from the first controller.

4. The server-rack system of claim 3, wherein the first watch dog circuit determines that the first controller has failed if the first watch dog circuit has not received the heartbeat signals from the first controller within a predetermined time period.

5. The server-rack system of claim 1, wherein the first watch dog circuit determines the health of the first controller by actively monitoring the health of the first controller.

6. The server-rack system of claim 5, wherein the first watch dog circuit determines that the first controller has failed if any operating parameter of the first controller goes beyond a predetermined specification.

7. The server-rack system of claim 1, wherein the one or more cooling components of the first server system include one or more cooling fans, and wherein the controlling the one or more cooling components of the first server system includes controlling a fan speed of the one or more cooling fans.

8. The server-rack system of claim 1, wherein the first controller is further configured to:
receive status information of the second server system;
determine that the second cooling control switch of the second server system is enabled to the external mode; and
based at least in part on (i) the received status information of the second server system and (ii) the determining that the second cooling control switch of the second server system is enabled to the external mode, control the one or more cooling components of the second server system.

9. The server-rack system of claim 8, wherein the first controller is further configured to:
receive temperature information of the second server system; and
based at least in part on the received temperature information of the second server system, further control the one or more cooling components of the second server system.

10. The server-rack system of claim 9, wherein the temperature information of the second server system comprises a temperature of the second controller, a temperature of a central processing unit (CPU) of the second server system, or a temperature of a storage device of the second server system.

11. The server-rack system of claim 9, wherein the first controller is configured to control the one or more cooling components of the second server system by sending pulse-width modulation (PWM) signals to the one or more cooling components of the second server system.

12. The server-rack system of claim 8, wherein the status information of the second server system includes the status information of the power supply unit (PSU) of the second server system, and wherein the first controller is further configured to control the one or more cooling components of the second server system based at least in part on the received status information of the PSU of the second server system.

13. The server-rack system of claim 1, wherein the first controller is further configured to:
receive temperature information of the first server system;
determine that the first cooling control switch is enabled to the internal mode; and
based at least in part on (i) the received temperature information of the first server system and (ii) the determining that the first cooling control switch is enabled to the internal mode, control the one or more cooling components of the first server system.

14. A computer-implemented method for controlling one or more cooling components in a server-rack system, comprising:
receiving, at a first controller of a first node in the server-rack system, status information of a first cooling component, the first cooling component being associated with the first node and coupled to a first cooling control switch of the first node, the first cooling control switch configured to alternate between an internal mode and an external mode;
in response to determining that the first cooling control switch of the first node is enabled to the internal mode, controlling, via a direct connection between the first controller and the first cooling control switch, the first cooling component based at least upon the received status information of the first cooling component;
receiving, at the first controller of the first node in the server-rack system, status information of (i) a second cooling component of a neighboring node and (ii) a power supply unit (PSU) of the neighboring node, the second cooling component being associated with the neighboring node and coupled to a second cooling control switch of the neighboring node, the second cooling control switch configured to alternate between an internal mode and an external mode; and in response to determining that (i) the second cooling control switch of the neighboring node is enabled to the external mode and (ii) the PSU of the neighboring node has not failed, controlling, via a direct connection between the first controller and the second cooling control switch, the second cooling component associated with the neighboring node based at least upon the received status information of the second cooling component.

15. The computer-implemented method of claim 14, wherein the first node comprises a first watch dog circuit coupled to the first cooling control switch and the first controller, the first watch dog circuit configured to monitor health of the first controller of the first node.

16. The computer-implemented method of claim 15, wherein, in response to the first watch dog circuit determining that the first controller of the first node has failed, the first watch dog circuit is operable to enable the first cooling control switch to the external mode and allow a second controller of the neighboring node to control the first cooling component associated with the first node via a direct connection between the second controller and the first cooling control switch.

17. The computer-implemented method of claim 16, wherein the first watch dog circuit is further configured to receive status information of an AC power supply and a power supply unit (PSU) of the first node, and operable to enable the first cooling control switch of the first node to the external mode only if both the AC power supply and the PSU of the first node have not failed.

18. The computer-implemented method of claim 15, wherein the watch dog circuit is operable to receive heartbeat signals from the controller of the first node, and wherein the watch dog circuit determines that the controller has failed if the watch dog circuit has not received the heartbeat signals from the controller within a predetermined time period.

19. The computer-implemented method of claim 14, furthering comprising:
  receiving temperature information of the neighboring node; and
  controlling, via the direct connection between the first controller and the second cooling control switch of the neighboring node, the second cooling component associated with the neighboring node based at least upon the temperature information of the neighboring node.

20. A non-transitory computer-readable storage medium including instructions that, when executed by a processor of a system, cause the system to perform operations for controlling one or more cooling components in a server-rack system, comprising:
  receiving, at a first controller of a first node in the server-rack system, status information of a first cooling component, the first cooling component being associated with the first node and coupled to a first cooling control switch of the first node, the first cooling control switch configured to alternate between an internal mode and an external mode;
  in response to determining that the first cooling control switch of the first node is enabled to the internal mode, controlling, via a direct connection between the first controller and the first cooling control switch, the first cooling component based at least upon the received status information of the first cooling component;
  receiving, at the first controller of the first node in the server-rack system, status information of a second cooling component of a neighboring node, the second cooling component being associated with the neighboring node and coupled to a second cooling control switch of the neighboring node, the second cooling control switch configured to alternate between an internal mode and an external mode;
  receiving status information of an AC power supply and a power supply unit (PSU) of the second node; and
  in response to determining that (i) the second cooling control switch of the neighboring node is enabled to the external mode and (ii) the AC power supply and the PSU of the second node have not failed, controlling, via a direct connection between the first controller and the second cooling control switch, the second cooling component associated with the neighboring node based at least upon the received status information of the second cooling component.

* * * * *